United States Patent
Yao et al.

(10) Patent No.: US 6,201,725 B1
(45) Date of Patent: Mar. 13, 2001

(54) NONVOLATILE MEMORY CELL STRUCTURE FOR INTEGRATION WITH SEMICONDUCTOR LOGIC DEVICES AND METHOD OF USING SAME

(75) Inventors: Chingchi Yao; Chung-Jen Chien, both of Saratoga, CA (US)

(73) Assignee: Oki Semiconductor, Sunnyvale, CA (US)

( * ) Notice: Subject to any disclaimer, the term of this patent is extended or adjusted under 35 U.S.C. 154(b) by 0 days.

(21) Appl. No.: 09/592,260

(22) Filed: Jun. 12, 2000

Related U.S. Application Data

(62) Division of application No. 09/218,026, filed on Dec. 22, 1998.

(51) Int. Cl.⁷ .................................... G11C 5/02
(52) U.S. Cl. ................... 365/51; 365/52; 365/185.05
(58) Field of Search .................. 365/51, 52, 53, 365/185.05; 257/279, 296, 304, 903

(56) References Cited

U.S. PATENT DOCUMENTS

| 5,338,969 | * | 8/1994 | Kaya .................................. 365/53 |
| 6,052,301 | * | 4/2000 | Ikeda et al. ...................... 365/52 |
| 6,108,242 | * | 8/2000 | Lin et al. .......................... 365/51 |
| 6,115,288 | * | 9/2000 | Amanai et al. ................... 365/51 |

* cited by examiner

Primary Examiner—Son T. Dinh
(74) Attorney, Agent, or Firm—Jones Volentine, L.L.C.

(57) ABSTRACT

A nonvolatile memory cell includes first and second MOS transistors, such as a PMOS transistor and NMOS transistor in a CMOS cell. One of the two transistors provides a floating gate for storing data while the other transistor is provided with a control gate for selecting the memory cell, and is connected with a bit line for reading data stored in the cell. The nonvolatile memory cell may be integrated into a logic device, such as a CMOS gate array, using PMOS and NMOS transistor cells formed in the gate array. In that case, the nonvolatile memory cell may be fabricated in a logic device with the standard processes used to produce the logic device.

3 Claims, 6 Drawing Sheets

NONVOLATILE MEMORY CELL STRUCTURE FOR INTEGRATION WITH SEMICONDUCTOR LOGIC DEVICES AND METHOD OF USING SAME

CROSS REFERENCE TO RELATED APPLICATIONS

This is a divisional application of application Ser. No. 09/218,026 filed Dec. 22, 1998, which is hereby incorporated by reference in its entirety for all purposes.

BACKGROUND OF THE INVENTION

1) Field of the Invention

This invention pertains to the field of semiconductor memory devices, and more particularly, to a nonvolatile memory cell produced of semiconductor transistor structures common to semiconductor logic devices.

2) Background of the Related Art

Semiconductor memory devices may be largely divided into Random Access Memories (RAMs) and Read Only Memories (ROMs). RAMs, also referred to as volatile memories because the stored data is destroyed with the passage of time upon removal of the power supply, allow rapid data storage and data retrieval. ROMS, also referred to as nonvolatile memories because they retain data once it is entered, typically have slower data storage and data retrieval times.

One popular type of ROM is the Electrically Erasable Programmable Read Only Memory (EEPROM) in which data is electrically programmed and erased. A flash EEPROM, which is electrically erasable at high speed without being removed from a circuit board, offers the advantages of a simple memory cell structure, cheap cost, and no need for a refresh signal to retain the data.

EEPROM cells are largely divided into two types: a NOR type EEPROM and a NAND type EEPROM.

FIG. 1 shows a circuit diagram for a NOR-type flash EEPROM cell 100. A metal oxide semiconductor (MOS) transistor 120 is provided with a floating gate 110 and a control gate 160. The floating gate 110 may be programmed with a charge according to the data to be stored in the memory cell 100. Data is read by selecting the transistor on a word line connected to the control gate 160 and detecting the presence or absence of a current through the transistor on a bit line 170 connected to one terminal of the device.

A number of different memory cell structures have been used for a nonvolatile memory device. FIG. 2 shows one configuration of a NOR-type Flash EEPROM cell 200 according to the prior art. The memory cell 200 comprises a semiconductor substrate 205 having first and second impurity regions 225 and 235 formed in a top surface of a well 202. The first impurity region 225 is connected with a bit line 270 of the memory device 200, while the second impurity region 235 is connected with ground potential. A first oxide later 230 is deposited on the top surface of the semiconductor substrate where the first and second impurity regions 225 and 235 are formed.

A floating gate 210 is formed on the first oxide layer 230 above and between the first and second impurity regions 225 and 235. A control gate 260 is also formed above and between the first and second impurity regions 225 and 235. A portion of the control gate 260 is formed above the floating gate 210, separated by a second oxide layer 250. The floating gate 210 and the control gate 260 may each be formed of conductive polysilicon layers.

To program the EEPROM device 200 with a potential $V_p$, the word line connected with the control gate 260 is supplied with a large positive potential $V_{PGM}$ (e.g., $V_{PGM}$=12.5 Volts). This causes an injection of electrons onto the floating gate 210. To read the data from the cell 200, a lower positive voltage $V_{cc}$, (e.g., 5 volts) is applied to the control gate while the bit line is supplied with a smaller positive voltage (e.g., 1–2 volts). Data 0 or 1 is read from the cell 200 according to the presence or absence of a current path through the cell, relying on the principle that the threshold voltage $V_{th}$ of the cell is changed to a voltage greater than +5V when electrons are stored in the cell, while the threshold voltage $V_{th}$ is about 1.5V when electrons are not stored on the floating gate. Data may be erased though exposure to ultraviolet light radiation, or through a separate erase gate (not shown).

Disadvantageously, these prior art nonvolatile memory cell structures are not readily adaptable to integration in a logic device such as a gate array. For example, the EEPROM cell 200 requires two polysilicon layers or more, whereas the typical gate array process uses a single polysilicon process. Yet, it is desirable to provide nonvolatile memory cells in a gate array device.

Accordingly, it would be advantageous to provide a nonvolatile memory cell which may be easily integrated into a semiconductor logic device. It would also be advantageous to provide a nonvolatile memory cell which may be easily integrated into a gate array logic device. It would be further advantageous to provide a nonvolatile memory cell which can use the same process technologies and array structures which are used to manufacture gate array logic circuitry. Other and further objects and advantages will appear hereinafter.

SUMMARY OF THE INVENTION

The present invention comprises a nonvolatile memory cell constructed from MOS transistor structures.

In one aspect of the invention, a nonvolatile memory call includes first and second MOS transistors. A gate of the first transistor is a control gate while a gate of the other transistor is a floating gate. In a preferred embodiment, the nonvolatile memory cell includes a PMOS transistor and an NMOS transistor in a CMOS cell.

In another aspect of the invention, a nonvolatile memory cell may be integrated into a logic device, such as a CMOS gate array, using PMOS and NMOS transistor cells formed in the gate array.

In another aspect of the present invention, a nonvolatile memory cell may be fabricated in a logic device with the standard processes normally used to produce such a logic device.

DESCRIPTION OF THE PREFERRED EMBODIMENTS

Figure 1:
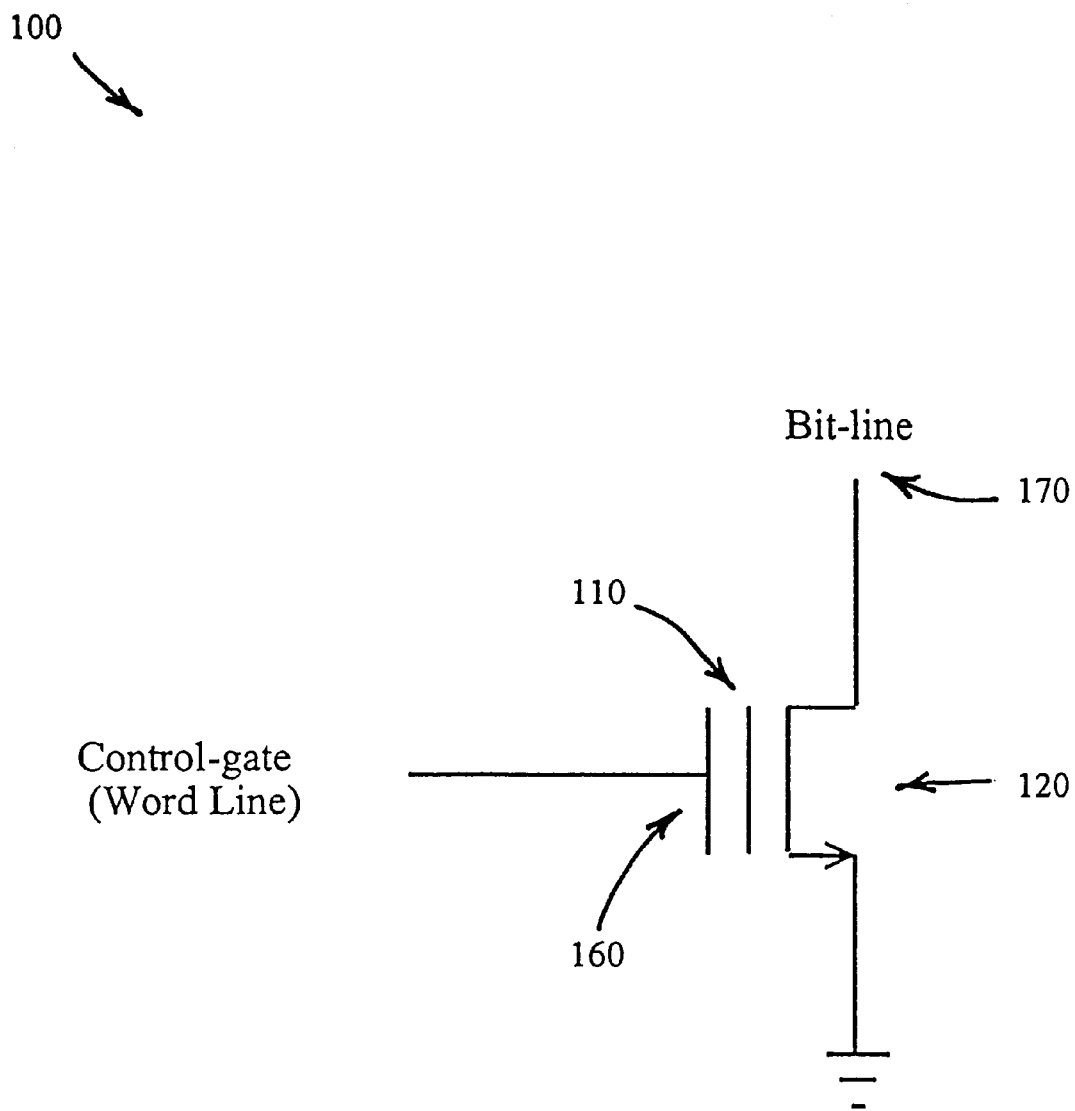
FIG. 1 is a circuit diagram of a nonvolatile memory cell device.
Figure 2:
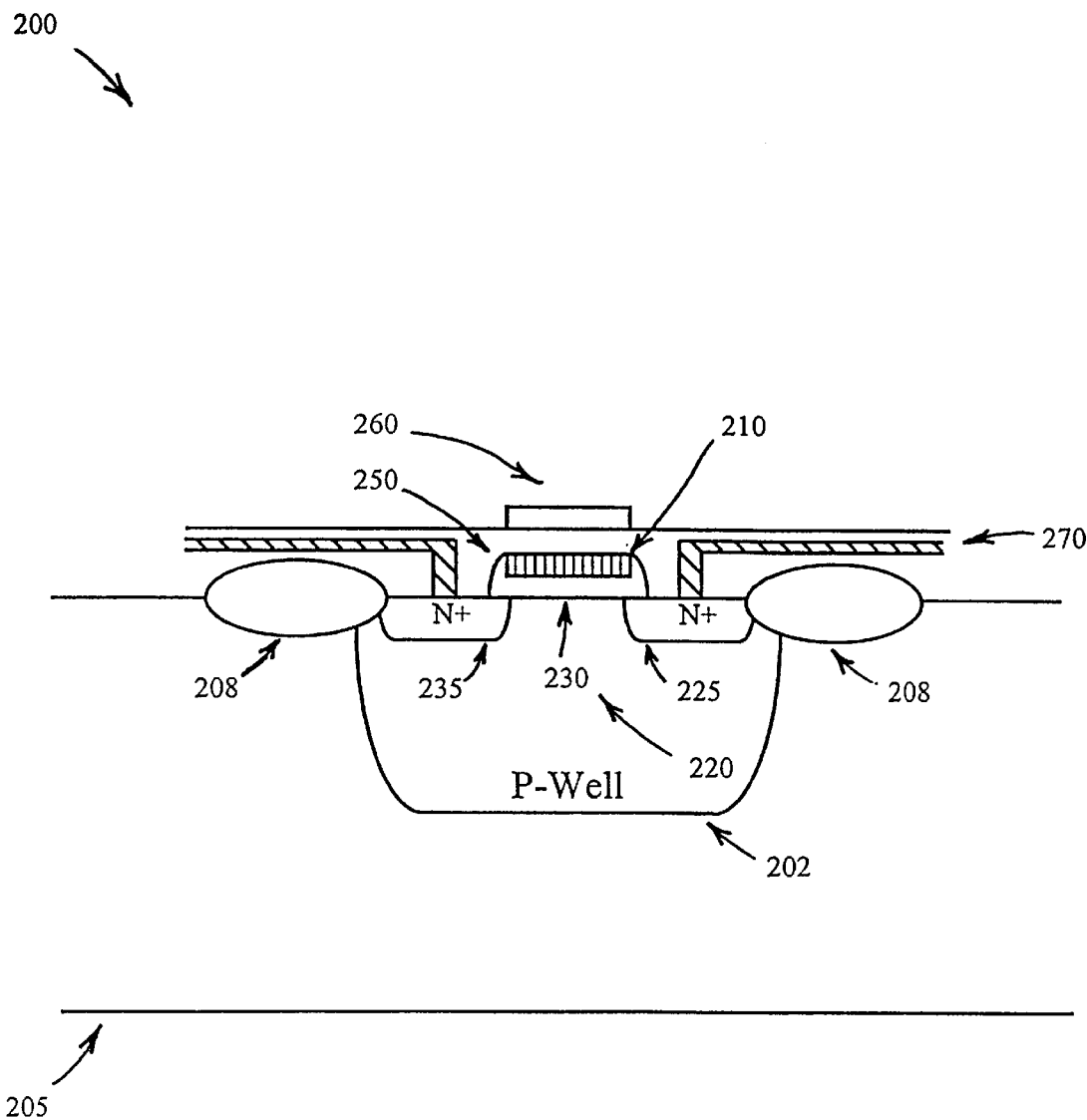
FIG. 2 shows a NOR-type flash EEPROM memory cell.
Figure 3:
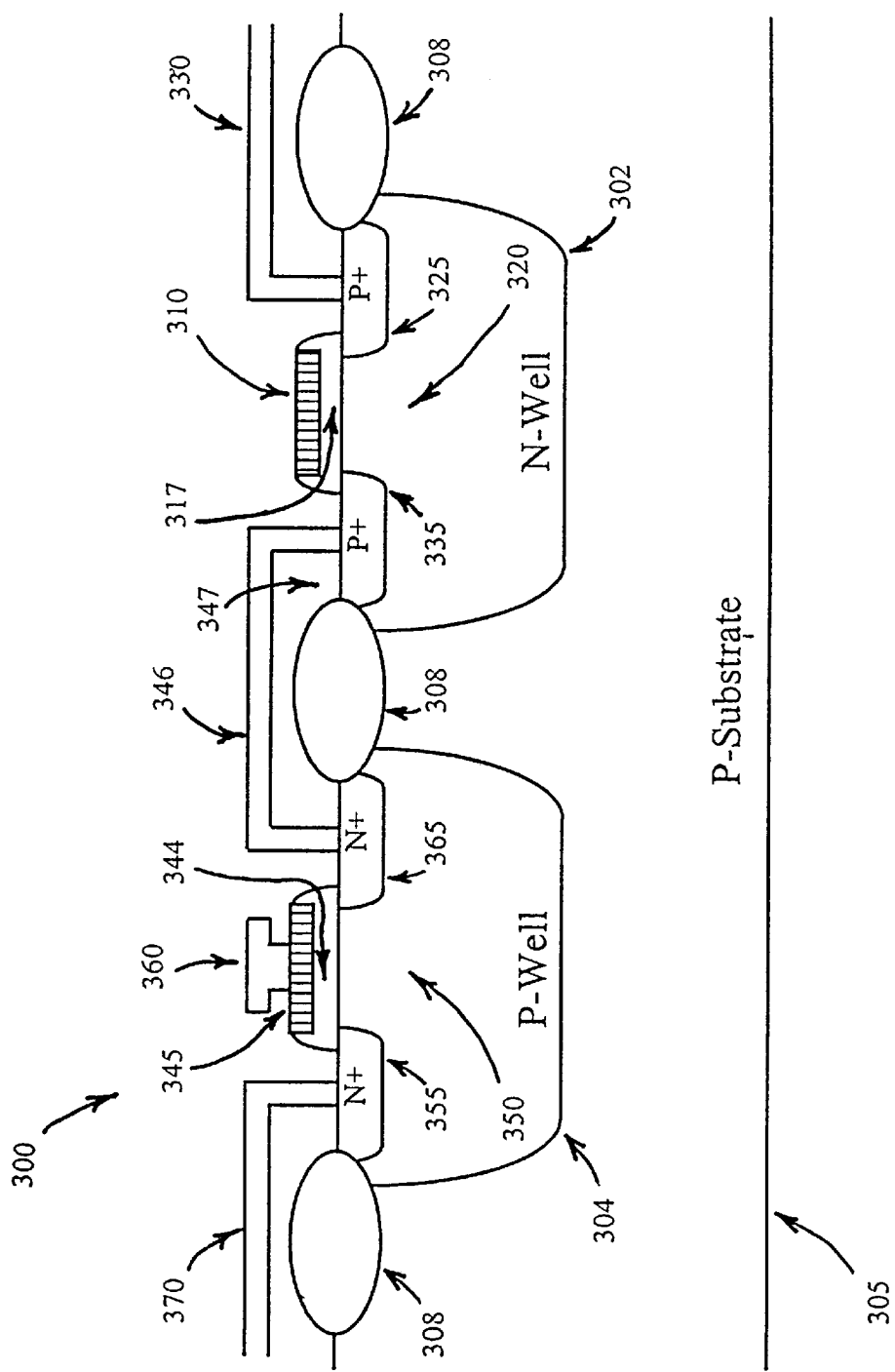
FIG. 3 shows a nonvolatile memory cell structure according to a first preferred embodiment of the present invention.

FIG. 3 shows a first preferred embodiment of a nonvolatile memory cell structure according to one or more aspects of the present invention. In the preferred embodiment of FIG. 3, a nonvolatile memory cell 300 comprises an N-well 302 and a P-well 304 formed in a top surface of a semiconductor substrate 305 and separated by a field oxide 308. A first impurity region 325 and a second impurity region 335, each doped with a P-type impurity, are formed in a top surface of the N-well 302. A $V_{cc}$ supply line 330 is formed and connected to the first impurity region 325. A gate electrode for a floating gate 310 is formed on an oxide film 317 above and between the impurity regions, producing a PMOS transistor 320.

The P-well 304 also has formed in a top surface a first impurity region 355 and a second impurity region 365, each doped with an N-type impurity. A gate electrode 345 is formed on an oxide layer 344 above and between the impurity regions 355 and 365, producing a NMOS transistor 350. The gate electrode 345 is connected with a control line 360 of the nonvolatile memory cell 300.

A metalization layer 346 is formed above the field oxide region 308. The metalization layer 346 connects the second impurity region 335 of the PMOS transistor 320 with the second impurity region 365 of the NMOS transistor 350. In a preferred embodiment, a dielectric layer 347 is formed between the metalization layer 346 and the field oxide region 308.

Also, the first impurity region 355 of the NMOS transistor 350 is connected with a bit line 370.

Figure 4:
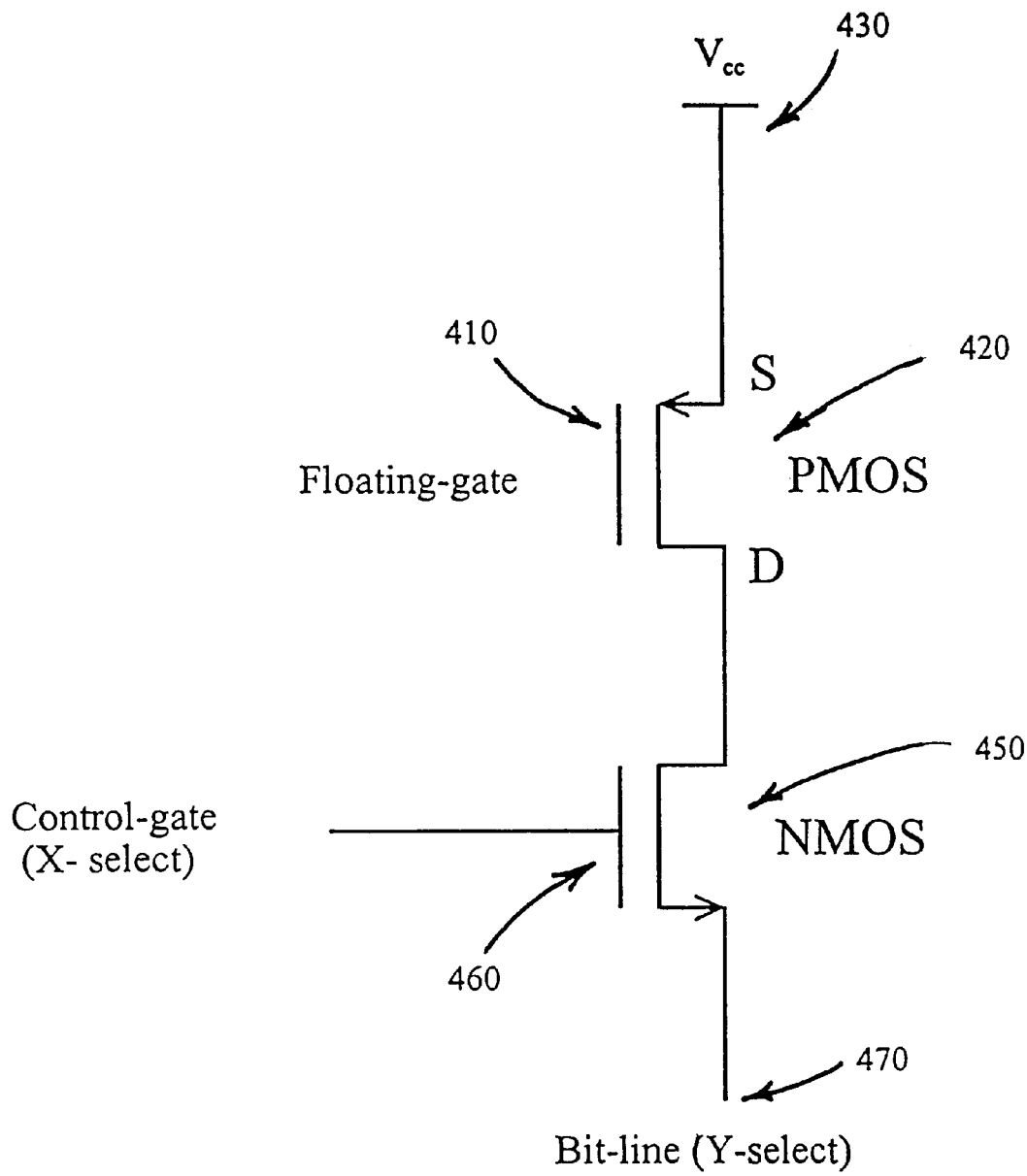
FIG. 4 shows a circuit diagram of a nonvolatile memory cell according to a first preferred embodiment of the present invention.

FIG. 4 is a circuit diagram for a first preferred embodiment of a nonvolatile memory cell 400 according to one or more aspects of the present invention. In the memory cell 400, a first MOS transistor 450 has a gate connected to a control gate 460 of the nonvolatile memory cell, a source connected to a Bit-line 470 and a drain connected to a drain of a second MOS transistor 420. The second MOS transistor 420 has a source connected with a supply $V_{cc}$ 420 and a gate which is the floating gate 410 of the non-volatile memory cell 400. In a preferred embodiment, the first MOS transistor 450 is an NMOS transistor and the second MOS transistor 420 is a PMOS transistor.

Operation of the nonvolatile memory cell 300 will now be described. When it is desired to program the memory cell 300, electrons are injected onto the floating gate 310 of the PMOS transistor 320. To accomplish this, for example, a negative voltage (e.g., −3 to −18 volts) may be applied on the $V_{cc}$ supply line 330 while the N-well 302 is held at ground potential. Electrons induced by the breakdown of the PN junction at the source of the PMOS transistor 320 are injected thereby onto the floating gate 310.

To read the data stored in the memory cell 300, it is determined whether or not a current will pass through the PMOS transistor 320 with the gate floating. To accomplish this, for example, a positive voltage (e.g., +1 to +10 volts) may be applied on the $V_{cc}$ supply line 330 which in turn applies the same potential to the N-well 302. Alternatively, the N-well 302 maye be held at a higher potential. The control gate 360 is supplied with a voltage to turn on the NMOS transistor 350 and the current through the transistor is sensed via the bit line 370. If a current is conducted, then the memory cell 300 is considered to store a first data value (e.g. "1") and if no current conducts, then the memory cell 300 is considered to store a second data value (e.g., "0").

To erase the memory cell 300, electrons are emitted from the floating gate 310 of the PMOS transistor 320 through the gate oxide 317 into the source or drain of the PMOS transistor 320 or into the substrate 305. To accomplish this, for example, a large positive voltage (e.g., +15 to +18 volts) may be applied on the $V_{cc}$ supply line 330 and/or the N-well 302. This will cause Fowler-Nordheim emission of electrons from the floating gate 310. Alternatively, the nonvolatile memory cell 300 may be erased by exposure to intense ultraviolet (UV) light in which case the memory cell 300 is a UVPROM.

Thus, a nonvolatile memory cell is formed from a CMOS structure comprising a PMOS and NMOS transistor appropriately fabricated and connected together.

In a preferred embodiment, the nonvolatile memory cell may be formed in a gate array device comprising a plurality of PMOS and NMOS transistors formed in N-wells and P-wells in a top surface of a semiconductor substrate.

Figure 5:
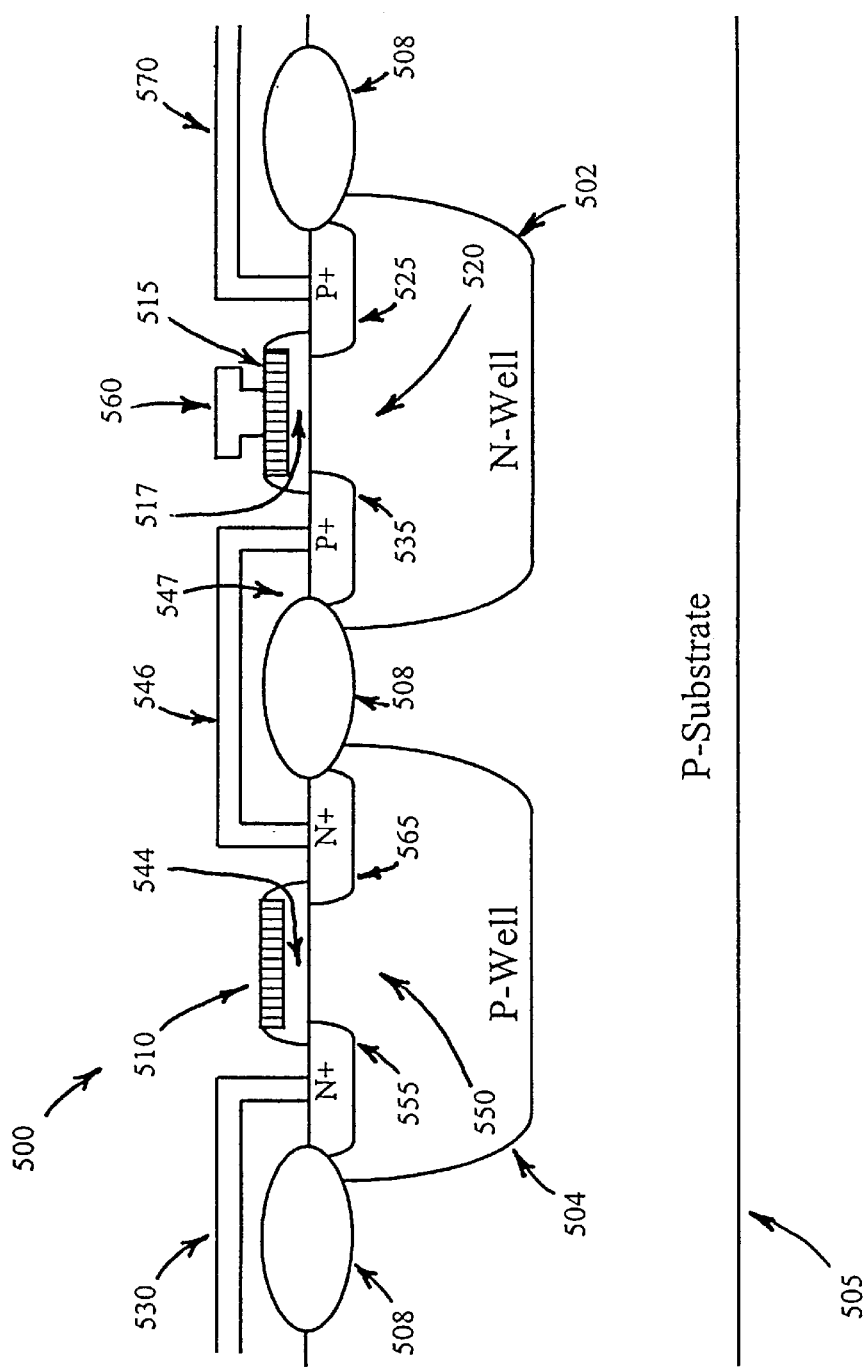
FIG. 5 shows a nonvolatile memory cell structure according to a second preferred embodiment of the present invention.

FIG. 5 shows a first preferred embodiment of a nonvolatile memory cell structure according to one or more aspects of the present invention. In the preferred embodiment of FIG. 5, a nonvolatile memory cell 500 comprises an N-well 502 and a P-well 504 formed in a top surface of a semiconductor substrate 505 and separated by a field oxide 508. A first impurity region 525 and a second impurity region 535, each doped with a P-type impurity, are formed in a top surface of the N-well 502. A gate electrode 515 is formed on an oxide film 517 above and between the impurity regions, producing a PMOS transistor 520.

A bit line 570 is formed and connected to the first impurity region 525. The gate electrode 515 is connected with a control line 560 of the nonvolatile memory cell 500.

The P-well 504 also has formed in a top surface a first impurity region 555 and a second impurity region 565, each doped with an N-type impurity. A gate electrode forming a floating gate 510 of the memory cell 500 is formed on an oxide layer 544 above and between the impurity regions 555 and 565, producing a NMOS transistor 550.

A metalization layer 546 is formed above the field oxide region 508. The metalization layer 546 connects the second impurity region 535 of the PMOS transistor 520 with the second impurity region 565 of the NMOS transistor 550. In a preferred embodiment, a dielectric layer 547 is formed between the metalization layer 546 and the field oxide region 508.

Also, the first impurity region 555 of the NMOS transistor 550 is connected with a $V_{cc}$ supply line 530.

Figure 6:
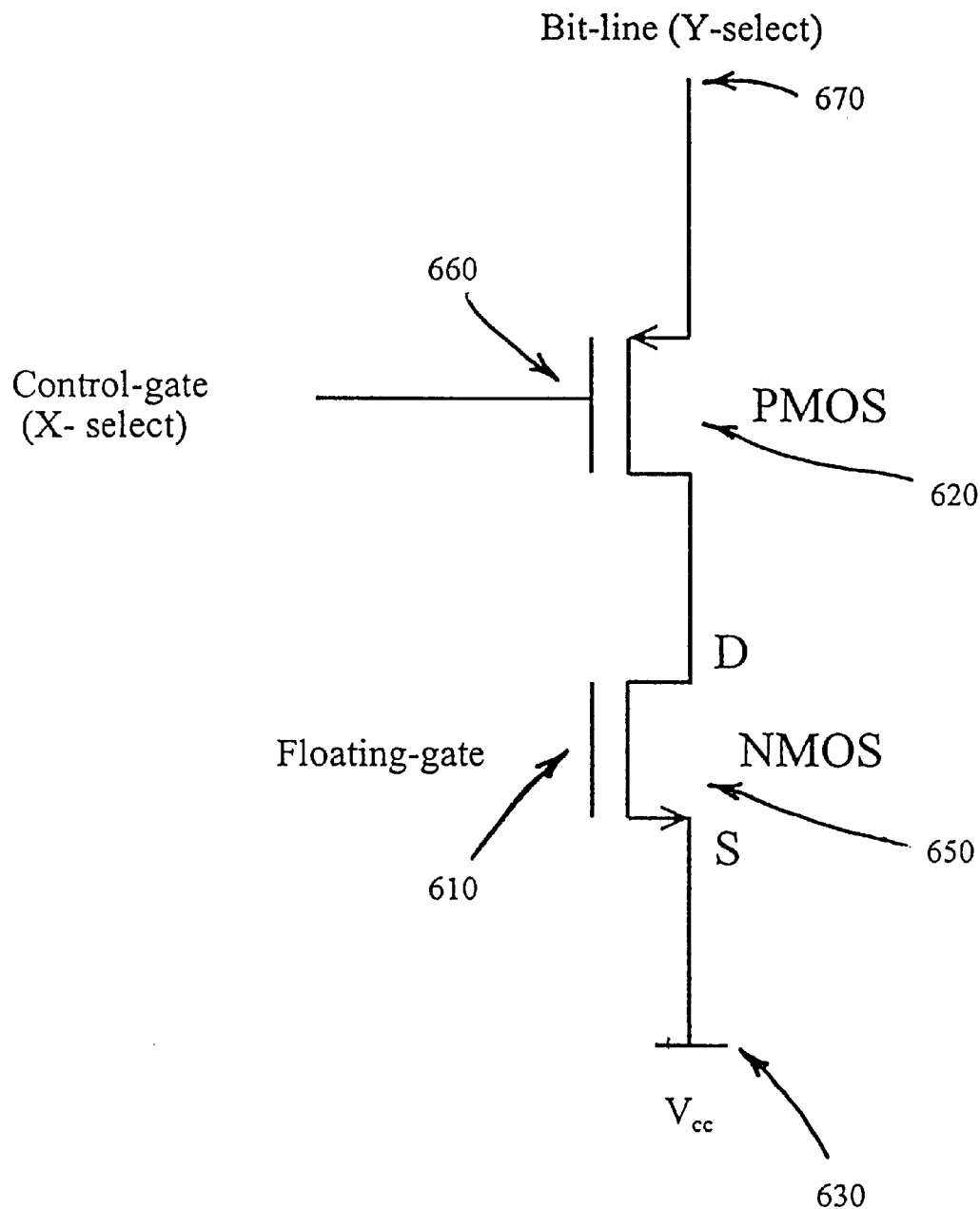
FIG. 6 shows a circuit diagram of a nonvolatile memory cell according to a second preferred embodiment of the present invention.

FIG. 6 is a circuit diagram for a first preferred embodiment of a nonvolatile memory cell 600 according to one or more aspects of the present invention. In the memory cell 600, a first MOS transistor 650 has a gate connected to a floating gate 610 of the nonvolatile memory cell, a source connected to a supply $V_{cc}$ 620 and a drain connected to a drain of a second MOS transistor 620. The second MOS transistor 620 has a source connected with a Bit-line 670 and a gate which is the control gate 660 of the non-volatile memory cell 600. In a preferred embodiment, the first MOS transistor 650 is an NMOS transistor and the second MOS transistor 620 is a PMOS transistor.

Operation of the nonvolatile memory cell 500 will now be described. When it is desired to program the memory cell 500, electrons are injected onto the floating gate 510 of the NMOS transistor 550. To accomplish this, for example, a positive voltage (e.g., +3 to +18 volts) may be applied on the $V_{cc}$ supply line 530 while the P-well 504 is held at ground potential. Electrons induced by the breakdown of the PN junction at the source of the NMOS transistor 550 are injected thereby onto the floating gate 510.

To read the data stored in the memory cell 500, it is determined whether or not a current will pass through the PMOS transistor 520 with the gate floating. To accomplish this, for example, a negative voltage (e.g., −1 to −10 volts) may be applied on the $V_{cc}$ supply line 530 while the P-well 504 is held at ground potential. The control gate 560 is supplied with a voltage to turn on the PMOS transistor 520 and the current through the transistor is sensed via the bit line 570. If a current is conducted, then the memory cell 500 is considered to store a first data value (e.g. "1") and if no current conducts, then the memory cell 500 is considered to store a second data value (e.g., "0").

To erase the memory cell 500, electrons are emitted from the floating gate 510 of the NMOS transistor 550 through the gate oxide 544 into the source or drain of the NMOS transistor 550 or into the substrate 505. To accomplish this, for example, a large positive voltage (e.g., +15 to +18 volts) may be applied on the $V_{cc}$ supply line 530, and/or the P-well 504. This will cause Fowler-Nordheim emission of electrons from the floating gate 510. Alternatively, the nonvolatile memory cell 500 may be erased by exposure to intense ultraviolet (UV) light in which case the memory cell 500 is a UVPROM.

While preferred embodiments are disclosed herein, many variations are possible which remain within the concept and scope of the invention. For example, although the embodiments shown in FIGS. 3 and 5 have a P-type substrate, the devices could be produced in an N-type semiconductor substrate. Also, although the above-described embodiments use one NMOS transistor and one PMOS transistor, both of the transistors could be NMOS transistors or PMOS transistors. Such variations would become clear to one of ordinary skill in the art after inspection of the specification, drawings and claims herein. The invention therefore is not to be restricted except within the spirit and scope of the appended claims.

What is claimed is:

1. A nonvolatile memory cell, comprising:

a semiconductor substrate;

a first well portion formed in and adjacent to a top surface of said semiconductor substrate;

first and second impurity regions formed in the first well portion;

a first gate electrode, formed above and between said first and second impurity regions of the first well portion;

a control line for selecting said memory cell, connected to said first gate electrode;

a bit line for reading data stored in said nonvolatile memory cell connected to said first impurity region of the first well portion;

a second well portion formed in and adjacent to the top surface of said semiconductor substrate outside of said first well portion;

first and second impurity regions formed in the second well portion, said first impurity region of said second well connected with a voltage supply line;

a second gate electrode, formed above and between said first and second impurity regions of the second well portion; and a metalization layer connecting the second impurity region of the first well portion and the second impurity region of the second well portion.

2. The nonvolatile memory cell of claim 1, wherein:

the substrate is of a first conductivity type;

the first well portion is of a second conductivity type;

the first and second impurity regions of said first well portion are of the first conductivity type;

the second well portion is of the first conductivity type; and the first and second impurity regions of said second well portion are of the second conductivity type.

3. The nonvolatile memory cell of claim 1, wherein:

the substrate is of a first conductivity type;

the first well portion is of the first conductivity type;

the first and second impurity regions of said first well portion are of a second conductivity type;

the second well portion is of the second conductivity type; and the first and second impurity regions of said second well portion are of the first conductivity type.

* * * * *